(12) United States Patent
Hsue

(10) Patent No.: US 8,916,902 B2
(45) Date of Patent: Dec. 23, 2014

(54) LED MODULE PACKAGING STRUCTURE WITH AN IC CHIP

(71) Applicant: UBLeds Co., Ltd., New Taipei (TW)

(72) Inventor: ShouWen Hsue, New Taipei (TW)

(73) Assignee: UBLeds Co., Ltd., New Taipei (TW)

( * ) Notice: Subject to any disclaimer, the term of this patent is extended or adjusted under 35 U.S.C. 154(b) by 36 days.

(21) Appl. No.: 13/865,171

(22) Filed: Apr. 17, 2013

(65) Prior Publication Data
US 2014/0312378 A1    Oct. 23, 2014

(51) Int. Cl.
*H01L 33/00* (2010.01)
*H01L 27/15* (2006.01)
*H01L 33/48* (2010.01)

(52) U.S. Cl.
CPC .............. *H01L 27/15* (2013.01); *H01L 33/48* (2013.01)
USPC .............................................. 257/99; 257/603

(58) Field of Classification Search
USPC .................................. 257/99, 100, 106, 603
See application file for complete search history.

(56) References Cited

U.S. PATENT DOCUMENTS 8,094,102 B2 * 1/2012 Huang ............................ 345/83

FOREIGN PATENT DOCUMENTS

TW          M356232          5/2009

* cited by examiner

*Primary Examiner* — Mark Prenty

(57) ABSTRACT

An improved LED module packaging structure with an IC chip includes a power input end in a packaging groove of a carrier stand connected to a zener diode and a power input port of the IC chip acquiring an operating power from the zener diode, so that the LED module applied to a full-color or self-color illuminant of central control utilizes the zener diode connected to the power input end within the packaging groove of the carrier stand to lower or modulate the voltage of an external power. While the IC chip receives a data signal from the data signal input end, the IC chip receives a matched operating voltage via the zener diode to drive the LED chip to shine, thereby attaining a long transmission of the central control easily.

8 Claims, 4 Drawing Sheets

LED MODULE PACKAGING STRUCTURE WITH AN IC CHIP

BACKGROUND OF THE INVENTION

1. Field of the Invention

The present invention relates to a LED module packaging structure controlled by a central signal for transmitting in long distance, in particular to an improved LED module packaging structure with an IC chip.

2. Description of the Related Art

Applications of a Light Emitting Diode (LED) can be divided into the functions of displaying and lightening. Except for the self-colored LED which has been popularly used in lightening, the multi-colored and the full-colored LED fulfills the visual demand on displaying. To display various colors of lights, each full-colored LED packaging structure includes at least red (R) LED chips, green (G) LED chips, and blue (B) LED chips, thereby mixing the RGB colors for various colors of lights. Because the percentage of the RGB colors that the colors of lights require are different, the full-colored LED needs to be matched to a driving unit for precisely controlling the mix light percentage of the RGB colors.

In tradition, a full-colored LED, a limiting resistance, and a driving unit are disposed on a printed circuit. After a plurality of circuit boards are electrically connected with each other, the full-colored LED is driven via an operating power and a control signal transmitted from central control. Most of the arrayed full-colored LED shadows are utilized to change in order to form a LED display screen. Although the conventional technique of LED display screen is completed, the limiting resistance and the driving unit need to be added onto the circuit boards, which may cause the distance between the adjacent full-colored LED to be too large, so that a more exquisite image is unable to be displayed. Further, the exposed driving unit is subject to Radio Frequency Interference (RFI) and Elector Magnetic Interference (EMI) easily.

Referring to the Taiwan patent number M356232 by "LED structure having integrated driving means" is disclosed. This prior art discloses that an IC chip and a limiting resistance are packaged in the carrier while packaging the red LED chips, the green LED chips, and the blue LED chips for forming a LED structure with an IC chip and a limiting resistance. Although this prior art improves the RFI and EMI problems and makes the displayed images more exquisite, it still has difficulty in transmitting the operating power and the control signal to the LED module from the central control. That is to say, most of the LED modules are sorted on the circuit board in array. The distances between each LED module and the central control end are not quite the same. Moreover, the central control end can be disposed far away from the circuit board. Boosting the operating power may attain a long distance transmission. However, the IC chip must be operated under a certain voltage which is generally 5V. If the voltage of the external power of the LED module is higher than the operating voltage of the IC chip, the operation of the IC chip is easily affected and may be damaged. Although the IC chip can receive the normal operating voltage by disposing an IC chip with constant voltage on the external power, the process of the circuit board or the using scheme of the electrical elements is not simplified.

SUMMARY OF THE INVENTION

It is an object of the present invention to provide an improved LED module packaging structure with an IC chip being a LED module which is formed by arranging a packaging groove on a carrier stand, injecting a transparent gel into the packaging groove, and packaging more than one LED chip and an IC chip in the packaging groove. Each LED chip and the IC chip are packaged in the packaging groove and integrated by a conductive integrating lamination. Around a side of the integrating lamination, a power input end, a power output end, at least one data signal input end, and at least one data signal output end are extended from an inside of the packaging groove to an outside of the carrier stand. One terminal of each LED chip is electrically connected to a controlling port of the IC chip. The other terminal of each LED chip is electrically connected to the power input end. The power input end is further connected to a zener diode for allowing a power input port of the IC chip to acquire an operating power from the zener diode. The power output end is electrically connected to the integrating lamination, and the integrating lamination is electrically connected to a power output port of the IC chip. At least one signal input port and at least one signal output port of the IC chip are electrically connected to the data signal input end and the data signal output end, respectively. The LED module applied to a full-color or self-color illuminant of central control utilizes the zener diode connected to the power input end within the packaging groove of the carrier stand to lower or modulate a voltage of an external power. While the IC chip receives a data signal from the data signal input end, the IC chip receives a matched operating voltage via the zener diode to drive the LED chip to shine, thereby attaining the long transmission of the central control easily.

It is a further object of the present invention to provide an improved LED module packaging structure with an IC chip. The power input end is connected to a two-way zener diode which is connected to the power input port of the IC chip in series. The two-way zener diode lowers the voltage of an external power, so that the IC chip receives the matched operating voltage from the two-way zener diode for operating. If the external power is reversely connected, the IC chip generates a protective effect via the two-way zener. Furthermore, a second two-way zener diode is in a series connection between the power input end and the integrating lamination, so that the IC chip and the LED chip integrated on the integrating lamination generate a positive and negative static electricity and a surge protection via the second two-way zener diode.

It is a further object of the present invention to provide an improved LED module packaging structure with an IC chip. The power input end is connected to a one-way zener diode which is connected to the power input port of the IC chip in series. The one-way zener diode lowers the voltage of the external power, so that the IC chip receives the matched operating voltage from the one-way zener diode for operating. A diode is further in a series connection between the power input end and the one-way zener diode, so that the diode generates a protective effect for the IC chip when the external power is reversely connected. Furthermore, a second two-way zener diode is in a series connection between the power input end and the integrating lamination, so that the IC chip and the LED chip integrated on the integrating lamination generate a positive and negative static electricity and a surge protection via the second two-way zener diode.

It is a further object of the present invention to provide an improved LED module packaging structure with an IC chip. The power input end is serially connected to a one-way zener diode, which is connected to the IC chip in parallel, via a resistance for forming a constant voltage circuit. The constant voltage circuit lowers and stabilizes the voltage of the external power, so that the IC chip receives the matched operating voltage from the serially connected one-way zener diode and the resistance for operating, and renders the IC chip and the LED chip provided with surge and static electricity protections.

The advantages of the present invention over the known prior arts will become more apparent to those of ordinary skilled in the art by reading the following descriptions with the relating drawings.

DETAILED DESCRIPTION OF THE PREFERRED EMBODIMENTS

Figure 1:
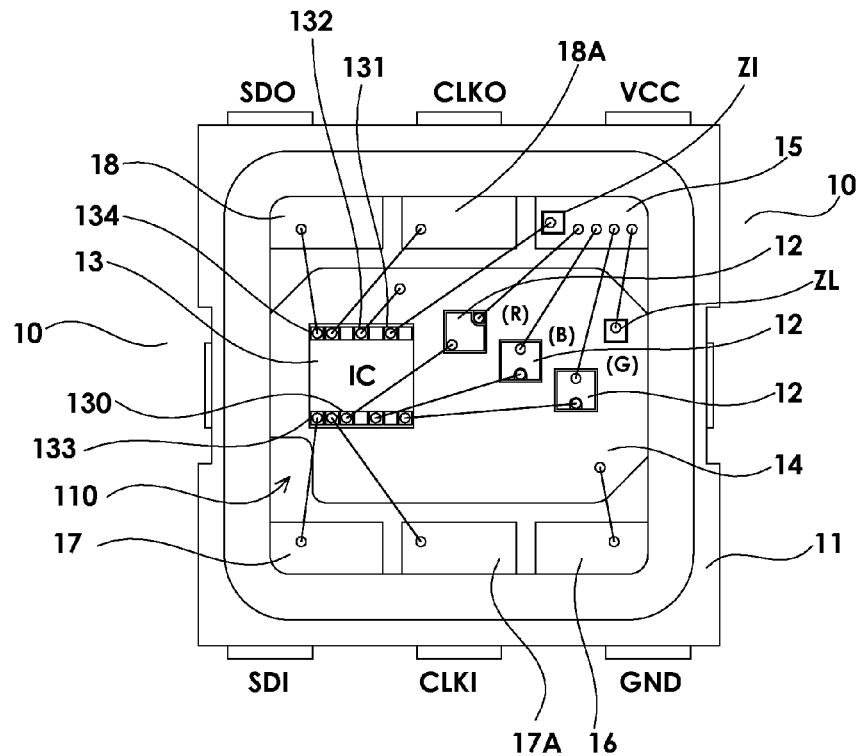
FIG. 1 is a schematic view showing a first preferred embodiment of the present invention.

Before describing in detail, it should note that the like elements are denoted by the similar reference numerals throughout disclosure.

Figure 2:
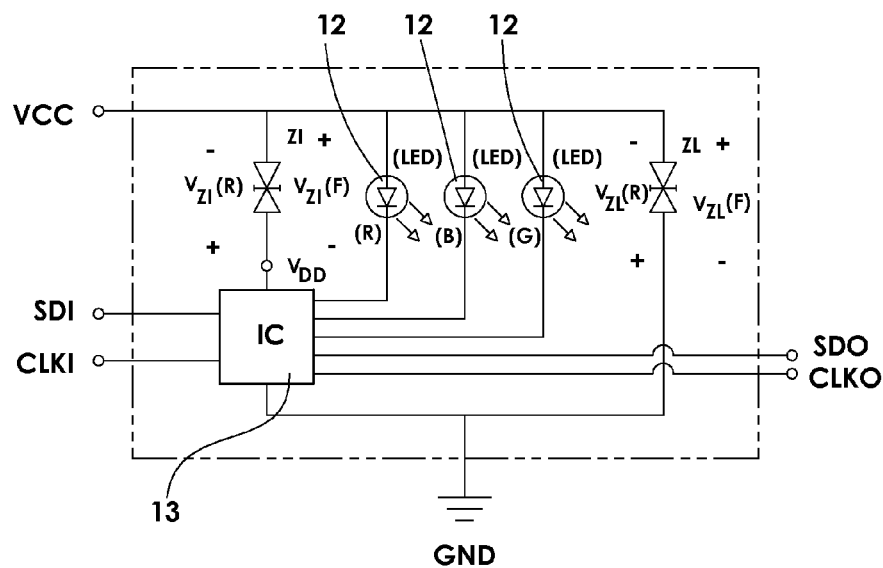
FIG. 2 is a schematic view showing an equivalent circuit of a packaging structure in FIG. 1.

The present invention provides an improved LED module packaging structure with an IC chip. Referring to FIGS. 1 and 2, a LED module 10 is formed by arranging a packaging groove 110 on a carrier stand 11, injecting a transparent gel (not shown) into the packaging groove 110, and packaging more than one LED chip 12 (the red, green, and blue chips), which can be red, green, and blue chips, and an IC chip 13 in the packaging groove 110. Each LED chip 12 (the red, green, and blue chips), namely the red, green, and blue chips and the IC chip 13 are packaged in the packaging groove 110 and integrated by a conductive integrating lamination 14. Around a side of the integrating lamination, a power input end 15, a power output end 16, at least one data signal input end 17, and at least one data signal output end 18 are extended from an inside of the packaging groove 110 to an outside of the carrier stand 11. One terminal of each LED chip 12 (the red, green, and blue chips) is electrically connected to a control port 130 of the IC chip 13 in wire bonding. The other terminal of each LED chip 12 (the red, green, and blue chips) is electrically connected to the power input end 15 in wire bonding. The power input end 15 is further connected to a zener diode for allowing a power inputting port 131 of the IC chip 13 to acquire an operating power VCC from the zener diode ZI in wire bonding. The power output end 16 is electrically connected to the integrating lamination 14 in wire bonding. The integrating lamination 14 is further electrically connected to a power output port 132 of the IC chip 13 in wire bonding, for grounding the IC chip 13 on the integrating lamination 14. At least one signal input port 133 and at least one signal output port 134 of the IC chip 13 are electrically connected to the data signal input end 17 and the data signal output end 18 in wire bonding, respectively. The LED module 10 applied to a full-color or self-color illuminant of central control (not shown) utilizes the zener diode ZI connected to the power input end 15 within the packaging groove 110 of the carrier stand 11 to lower or modulate the voltage of the external power VCC. That is to say, when VCC≥VDD, the condition of ZI is VZI(F)=VCC (Max)−VDD (Max). Therefore, while the IC chip 13 receives a data signal from the data signal input end 17, the IC chip 13 receives a matched operating voltage via the zener diode ZI to drive the LED chip 13 to shine, thereby attaining a long transmission of the central control (not shown) easily and without complicated external circuit board or elements.

Figure 3:
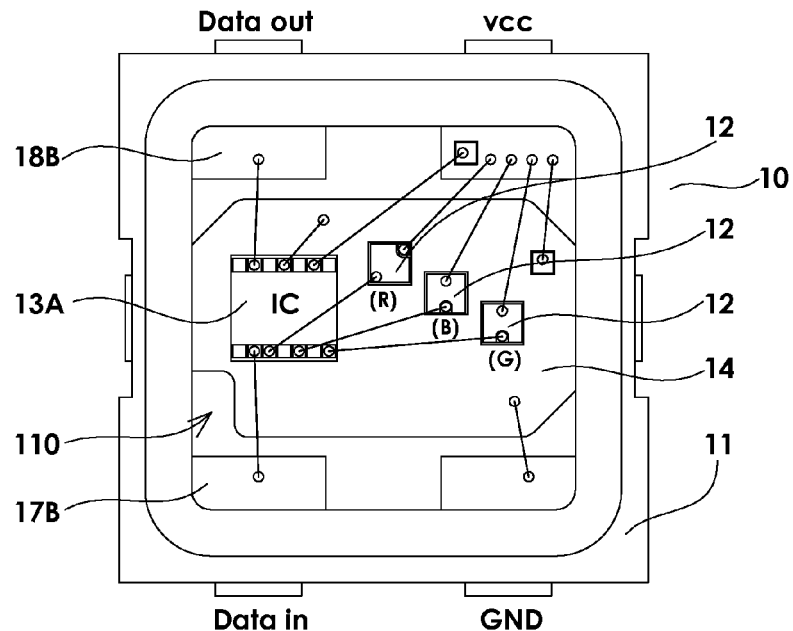
FIG. 3 is a schematic view showing a packaging structure of the first preferred embodiment of the present invention when a central control is a one-way signal.
Figure 4:
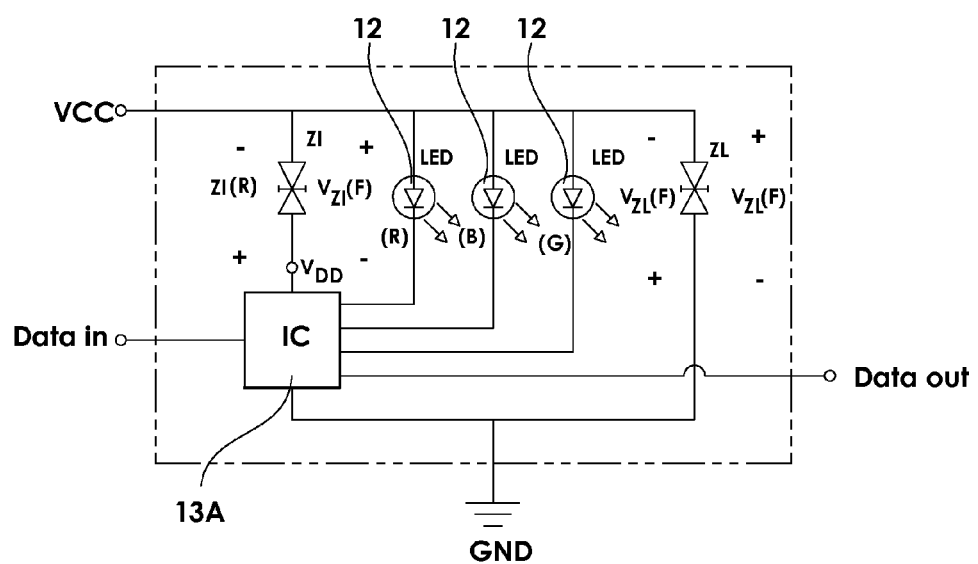
FIG. 4 is a schematic view showing an equivalent circuit of the packaging structure in FIG. 3.

Referring to FIGS. 1 and 2, when the central control (not shown) controls the IC chip 13 with dual-wire signal, namely the serial data (SD) and the clock data (CLK), a serial data signal input end (SDI) 17, a serial data signal output end (SDO) 18, a clock data signal input end (CLKI) 17A, and a clock data signal input end (CLKO) 18A are arranged in the packaging groove 10. Therefore, the IC chip 13 controlled by the dual wire receives the SD and CLK signals transmitted from the central control (not shown) via the serial data signal input end 17 and the clock data signal input end 17A. Moreover, the IC chip 13 sends the SD and CLK signals via the serial data signal output end 18 and the clock data signal output end 18A. Referring to FIGS. 3 and 4, when the central control (not shown) controls the IC chip 13A with single-wire signal, namely the data signal, a data signal input end (Data in) 17B and a data signal output end (Data out) 18B are arranged in the packaging groove 10, so that the IC chip 13A controlled by single wire receives the data signal transmitted from the central control (not shown) via the data signal input end 17B. Referring to FIGS. 1, 2, 3, and 4, whether the central control controls the IC chip 13 or 13A with the dual wire (SD and CLK signal wires) or the single wire (Data signal wire), it depends on the system.

Therefore, the present invention does not affect the central control and attains the long transmission easily.

Referring to FIGS. 1 and 2, the power input end 15 is electrically connected to a two-way zener diode ZI which is serially connected to the power input port 131 of the IC chip 13 in wire bonding. The two-way zener diode ZI lowers the voltage of the external power VCC, so that the IC chip 13 receives the matched operating voltage from one terminal of the two-way zener diode ZI for operating. Furthermore, while the external power VCC is reversely connected, the IC chip 13 generates a protective effect via the two-way zener diode ZI. A second two-way zener diode ZL, which is electrically mounted on the integrating lamination 14, is in a series connection between the power input end 15 and the integrating lamination 14 in wire bonding, so that the IC chip 13 and the LED chips 12 (the red, green, and blue chips) integrated on the integrating lamination 14 generate a positive and negative static electricity and a surge protection via the second two-way zener diode ZL. That is to say, the condition of ZL is VZL(F)=VZL(R)>VCC (Max), and VZL(R)<VZI(R).

Figure 5:
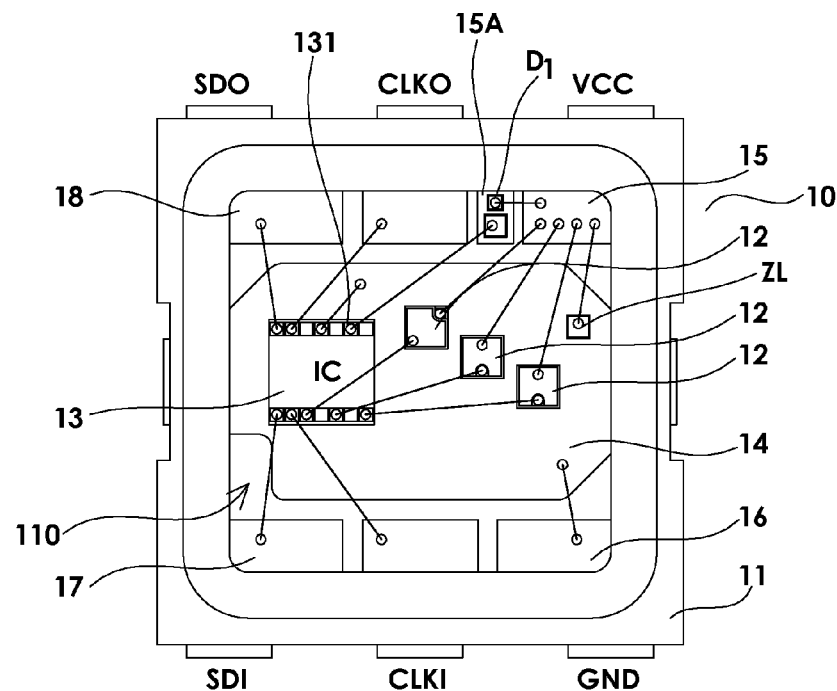
FIG. 5 is a schematic view showing a packaging structure of a second preferred embodiment of the present invention.
Figure 6:
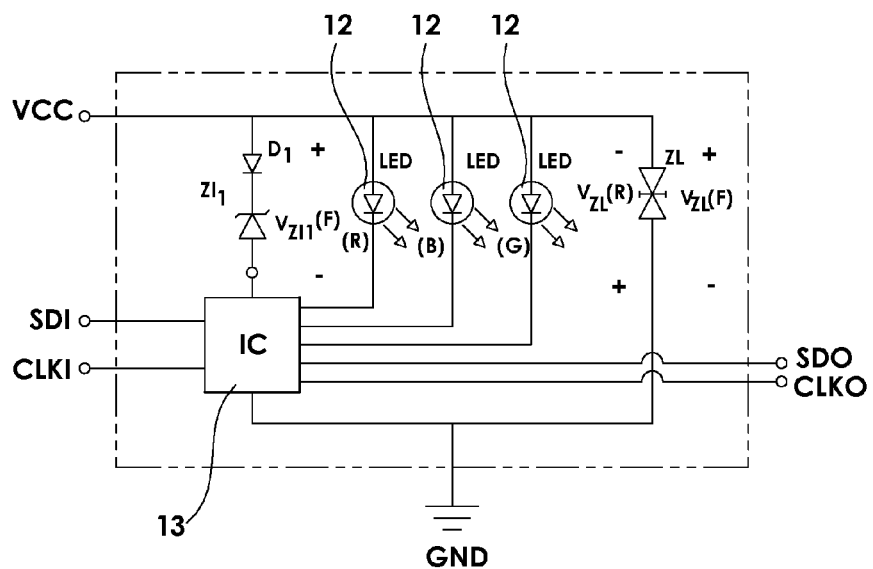
FIG. 6 is a schematic view showing an equivalent circuit of the packaging structure in FIG. 5.

Referring to FIGS. 5 and 6, the power input end 15 is connected to a one-way zener diode ZI1 serial which is serially connected to the power input port 131 of the IC chip 13 in wire bonding. The one-way zener diode ZI1 lowers the voltage of the external power VCC, namely when VCC≥VDD (Max), ZI1 equals ZI1(F)=VCC(Max)−VDD(Max), so that the IC chip 13 receives the matched operating voltage from the one-way zener diode ZI1 for operating. The power input end 15 electrically shunts a second power input end 15A, and the one-way zener diode ZI1 is electrically mounts on the power input end 15A. A diode D1 is in a series connection between the power input end 15 and the one-way zener diode ZI1. For example, the diode D1 is electrically mounted on the second power input end 15A and electrically connected to the power input end 15 in wire bonding so as to utilize the diode D1 to generate a protection when the external power VCC is reversely connected. Furthermore, a second two-way zener diode ZL, which is electrically mounted on the integrating lamination 14, is in a series connection between the power input end 15 and the integrating lamination 14 in wire bonding, so that the IC chip 13 and the LED chips 12(the red, green, and blue chips) integrated on the integrating lamination 14 generate a positive and negative static electricity and a surge protection via the second two-way zener diode ZL. That is to say, the condition of ZL is VZL1(F)=VZL1(R)>VCC(Max).

Figure 7:
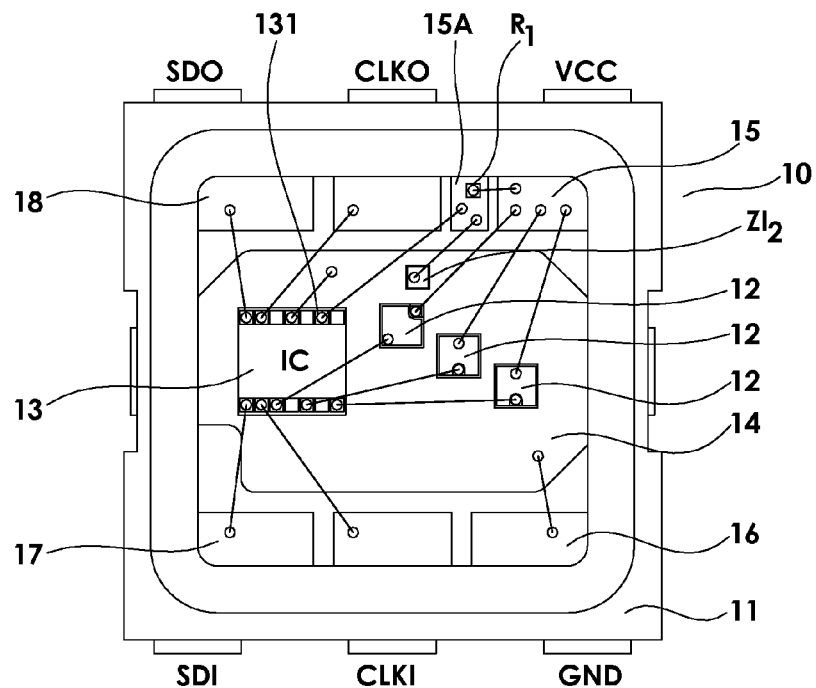
FIG. 7 is a schematic view showing a packaging structure of a third preferred embodiment of the present invention.
Figure 8:
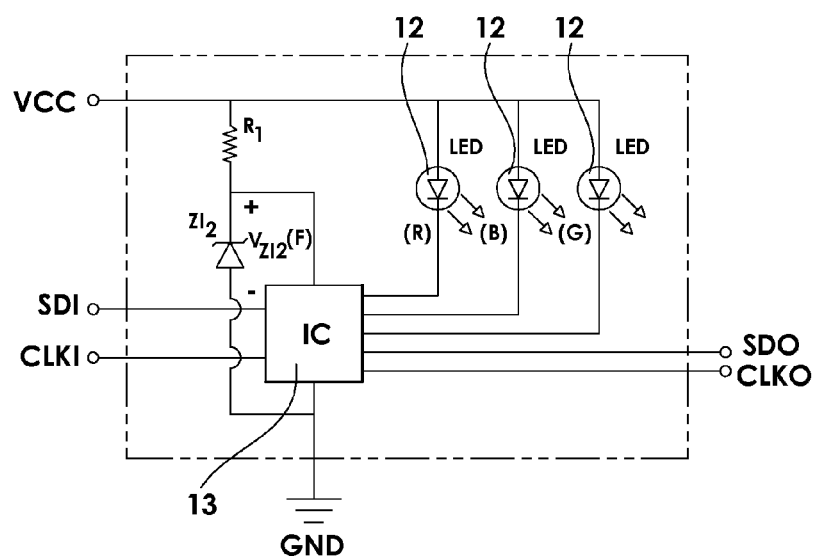
FIG. 8 is a schematic view showing an equivalent circuit of the packaging structure in FIG. 7.

Referring to FIGS. 7 and 8, a third preferred embodiment of the present invention is shown. The power input end 15 electrically shunts a second power input end 15A. A resistance R1, which is electrically connected to the power input end 15 in wire bonding, is electrically mounted on the second power input end 15A in order to form a constant voltage circuit by serially connecting the resistance R1 to a one-way zener diode ZI2 which is connected to the IC chip 13 in parallel. For example, the integrating lamination 14 is electrically mounted on the one-way zener diode ZI2, and the one-way zener diode ZI2 and the power input port 131 of the IC chip 13 are electrically connected to the second power input end 15A in wire bonding for forming the constant voltage circuit, thereby lowering and stabilizing the voltage of the external power VCC. Therefore, the IC chip 13 is able to receive the matched operating voltage via the serially connected one-way zener diode ZI2 and the resistance R1. Furthermore, the IC chip 13 and the LED chip 12 (the red, green, and blue chips) are provided with the surge and the static electricity protection.

While we have shown and described the embodiment in accordance with the present invention, it should be clear to those skilled in the art that further embodiments may be made without departing from the scope of the present invention.

What is claimed is:

1. An improved LED module packaging structure with an IC chip being a LED module which is formed by arranging a packaging groove on a carrier stand, injecting a transparent gel into said packaging groove, and packaging more than one LED chip and an IC chip in said packaging groove;

each LED chip and said IC chip being packaged in said packaging groove and integrated by a conductive integrating lamination;

around a side of said integrating lamination, a power input end, a power output end, at least one data signal input end and at least one data signal output end being extended from an inside of said packaging groove to an outside of said carrier stand; one terminal of each LED chip being electrically connected to a controlling port of said IC chip;

the other terminal of each LED chip being electrically connected to said power input end;

said power input end being connected to a zener diode for allowing a power input port of said IC chip to acquire an operating power from said zener diode;

said power output end being electrically connected to said integrated lamination, and said integrated lamination being electrically connected to a power output port of said IC chip;

at least one signal input port and at least one signal output port of said IC chip being electrically connected to said data signal input end and said data signal output end, respectively.

2. The improved LED module packaging structure with an IC chip as claimed in claim 1, wherein said power input end is connected to a two-way zener diode which is connected to said power input port of said IC chip in series.

3. The improved LED module packaging structure with an IC chip as claimed in claim 2, wherein a second two-way zener diode is in a series connection between said power input end and said integrated lamination.

4. The improved LED module packaging structure with an IC chip as claimed in claim 1, wherein said power input end is connected to a one-way zener diode which is connected to said power input port of said IC chip in series.

5. The improved LED module packaging structure with an IC chip as claimed in claim 4, wherein a diode is in a series connection between said power input end and said one-way zener diode.

6. The improved LED module packaging structure with an IC chip as claimed in claim 4, wherein a second two-way zener diode is in a series connection between said power input end and said integrated lamination.

7. The improved LED module packaging structure with an IC chip as claimed in claim 5, wherein a second two-way zener diode is in a series connection between said power input end and said integrated lamination.

8. The improved LED module packaging structure with an IC chip as claimed in claim 1, wherein said power input end is serially connected to a one-way zener diode, which is connected to said IC chip in parallel, via a resistance in order to form a constant voltage circuit.

* * * * *